US009466383B2

(12) United States Patent
Peng et al.

(10) Patent No.: US 9,466,383 B2
(45) Date of Patent: Oct. 11, 2016

(54) NON-VOLATILE MEMORY AND METHOD WITH ADAPTIVE LOGICAL GROUPS

(71) Applicant: SanDisk Technologies Inc., Plano, TX (US)

(72) Inventors: Yong Peng, Milpitas, CA (US); Rajeev Nagabhirava, Santa Clara, CA (US)

(73) Assignee: SanDisk Technologies LLC, Plano, TX (US)

( * ) Notice: Subject to any disclaimer, the term of this patent is extended or adjusted under 35 U.S.C. 154(b) by 216 days.

(21) Appl. No.: 14/144,056

(22) Filed: Dec. 30, 2013

(65) Prior Publication Data
US 2015/0186270 A1    Jul. 2, 2015

(51) Int. Cl.
| | |
|---|---|
| *G06F 12/06* | (2006.01) |
| *G11C 16/16* | (2006.01) |
| *G06F 12/10* | (2016.01) |
| *G06F 12/02* | (2006.01) |

(52) U.S. Cl.
CPC ........... *G11C 16/16* (2013.01); *G06F 12/0246* (2013.01); *G06F 12/10* (2013.01); *G06F 2212/2022* (2013.01); *G06F 2212/7201* (2013.01); *G06F 2212/7202* (2013.01); *G06F 2212/7205* (2013.01)

(58) Field of Classification Search
CPC ..................... G06F 12/0653; G06F 2212/221; G06F 2212/2022; G06F 2212/7201; G11C 16/16
See application file for complete search history.

(56) References Cited

U.S. PATENT DOCUMENTS

| | | | |
|---|---|---|---|
| 5,070,032 A | 12/1991 | Yuan et al. | 438/267 |
| 5,095,344 A | 3/1992 | Harari | 257/328 |
| 5,313,421 A | 5/1994 | Guterman et al. | 365/185.15 |
| 5,315,541 A | 5/1994 | Harari et al. | 365/185.13 |
| 5,343,063 A | 8/1994 | Yuan et al. | 257/317 |
| 5,570,315 A | 10/1996 | Tanaka et al. | 365/185.22 |
| 5,661,053 A | 8/1997 | Yuan | 438/257 |
| 5,768,192 A | 6/1998 | Eitan | 365/185.24 |
| 5,903,495 A | 5/1999 | Takeuchi et al. | 365/185.03 |
| 6,011,725 A | 1/2000 | Eitan | 365/185.33 |
| 6,046,935 A | 4/2000 | Takeuchi et al. | 365/185.03 |
| 6,222,762 B1 | 4/2001 | Guterman et al. | 365/185.03 |
| 6,567,307 B1 | 5/2003 | Estakhri | |

(Continued)

OTHER PUBLICATIONS

Eitan et al., "NROM: A Novel Localized Trapping, 2-Bit Nonvolatile Memory Cell", IEEE Electron Device Letters, vol. 21, No. 11, 2000, pp. 543-545.

*Primary Examiner* — Yaima Rigol
*Assistant Examiner* — Glenn Gossage
(74) *Attorney, Agent, or Firm* — Brinks Gilson & Lione

(57) ABSTRACT

A nonvolatile memory is organized into blocks as erase units and physical pages as read/write units. A host addresses data by logical pages, which are storable in corresponding physical pages. Groups of logical pages may be further aggregated into logical groups as addressing units. The memory writes host data in either first or second write streams, writing to respective blocks either logical-group by logical-group or logical-page by logical-page in order to reduce the size of logical-to-physical-address maps that are cached in a controller random-access memory (RAM). A group-level map may be used to track logical groups. A page-level map may be used to track logical pages. Only one block at a time needs be open in the second stream to accept logical pages from multiple logical groups that are active. Garbage collection is performed on the blocks from each write stream independently without data copying between the two streams.

20 Claims, 11 Drawing Sheets

Adaptive Group-based Mapping

(56) References Cited

U.S. PATENT DOCUMENTS

| | | |
|---|---|---|
| 7,441,090 B2 | 10/2008 | Estakhri et al. |
| 7,523,249 B1 | 4/2009 | Estakhri et al. |
| 7,774,576 B2 | 8/2010 | Estakhri et al. |
| 7,827,378 B2 | 11/2010 | Feldman et al. |
| 8,094,500 B2 | 1/2012 | Paley et al. |
| 8,244,960 B2 | 8/2012 | Paley et al. |
| 8,700,840 B2 | 4/2014 | Paley et al. |
| 2005/0144365 A1* | 6/2005 | Gorobets ............ G06F 11/1072 711/103 |
| 2008/0301359 A1* | 12/2008 | Smith .................. G06F 3/0616 711/103 |
| 2009/0070518 A1* | 3/2009 | Traister ............... G06F 12/0246 711/103 |
| 2010/0172180 A1 | 7/2010 | Paley et al. |
| 2010/0174869 A1* | 7/2010 | Gorobets ............ G06F 12/0246 711/135 |
| 2010/0257309 A1* | 10/2010 | Barsky ................ G06F 12/0246 711/103 |
| 2012/0297122 A1* | 11/2012 | Gorobets ............ G06F 12/0246 711/103 |
| 2013/0024609 A1* | 1/2013 | Gorobets ............ G06F 12/0246 711/103 |
| 2013/0042057 A1* | 2/2013 | Sinclair .................. G06F 3/061 711/103 |

\* cited by examiner

Host's Logical Address Space

Example Logical Pages

Example NAND Array Architecture

Erase Block Architecture

Multiple Logical Groups stored in a LG Block

Multiple LG Blocks Open in Write Stream 1

NON-VOLATILE MEMORY AND METHOD WITH ADAPTIVE LOGICAL GROUPS

FIELD OF THE INVENTION

This application relates to the operation of re-programmable non-volatile memory systems such as semiconductor flash memory, and, more specifically, to a flash memory having good performance for short random writes yet not incurring a large logical to physical address map.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, whether embedded or in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed from an "erased" state to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeably with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An oxide-nitride-oxide ("ONO") dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Read, Write and Erase Performance

In order to improve read and program performance, multiple charge storage elements or memory transistors in an array are read or programmed in parallel. Thus, a "page" of memory elements or cells are read or programmed together. In existing memory architectures, a row typically contains several interleaved pages or it may constitute one page of contiguous memory cells.

In flash memory systems, an erase operation may take as much as an order of magnitude longer than read and program operations. Thus, it is typical to organize the memory cells into blocks, and the memory cells in each block are erased together in a "flash". Each block typically contains many pages. In this way, the erase time is amortized over a large aggregate of memory cells in a block. In some embodiments, the block of memory cells could be constituted from several memory planes and is more specifically referred to as a "metablock". For example, a block may have 4 MB memory cells and contain 1K pages if each page has 4 KB memory cells, so a thousand pages are erased together as a unit.

Impact of Block Architecture on Updates and Garbage Collection

The nature of flash memory predicates that a memory cell must always be programmed from the erase state. Unlike magnetic storage or volatile RAM, a previously written location cannot be simply overwritten. The previously written location must first be erased to the erase state before another write can take place. Thus, data are written page by page only to unwritten locations of a block.

If a host writes data of a certain logical address and then updates the data of the logical address again, the updated data cannot overwrite the existing location, but must be written to an erased location. Thus, for the same logical address there are now a current version and an older version. Over several generations of updates, this will result in a number of older versions and a latest updated version of the data among the blocks. When the data with the logical address is read, the latest updated version is accessed; the older versions are treated as obsolete (garbage) data and ignored.

Through use of the memory, obsolete data may accumulate and take up memory space which could otherwise be used for user data. A garbage collection operation is performed to clean out the obsolete data. Since data is stored in blocks, a first block containing a mixture of non-obsolete and obsolete data must first have the non-obsolete data saved by copying to a second block before the first block can be erased. In this way, the obsolete data are "collected" so that the space freed up can be recycled. Garbage collection takes time as it also involves saving non-obsolete data to another block. The time and resource expended are exacerbated if there are more non-obsolete data to copy, which increases with at least two parameters: block size; and the degree of mixing of obsolete and non-obsolete data in each block.

Impact of Block Architecture on Logical to Physical Address Map

Flash memory systems are most commonly provided in the form of a memory card or flash drive that is removably connected with a variety of hosts such as a personal computer, a camera or the like, but may also be embedded within such host systems. A non-volatile memory is typically used by a host to store host data and to retrieve the data at a later time. The host supports applications which can generate and manipulate data files. An operating system in the host provides a data file structure in which a data file is organized into a plurality of logical sectors (typically of 512 bytes). Each logical sector is assigned a logical address, referred to as LBA ("logical block address") and where the "block" here refers to a block (sector) of data. Thus, the operating system of the host organizes the data from the host-side logical-sector by logical-sector; each logical sector is assigned a unique logical address within a continuous virtual address space of the host. In another embodiment, the unit of address is a cluster of several logical sectors, such as a logical page.

FIG. 1 illustrates schematically the logical address space of a host operating system. Currently, a standard logical addressing scheme is logical block addressing. The host data is parceled out into sectors or blocks of fixed size, typically the size of one sector (512 byte). This LBA "block" is not the same as the erase block of a flash memory. Logical block addressing simply numbers the logical sectors sequentially from 0, 1, 2, 3, . . . . On the other hand, the erase block of the physical memory contains a large number of physical pages, each physical page for storing a logical page of data. Each logical page may be constituted from one or more logical sectors. For example, a logical page, such as logical page 62 of FIG. 2, may contain 4 KB of data corresponding to 8 logical sectors.

When the currently prevalent LBA interface to the memory system is used, files generated by a host to which the memory is connected are assigned unique addresses within the logical address space of the interface. The memory system then commonly maps data between the logical address space and pages of the physical blocks of memory. The memory system keeps track of how the logical address space is mapped into the physical memory but the host has no knowledge of this logical to physical address mapping. On the other hand, the host keeps track of the addresses of its data files within the logical address space but the memory system operates with little or no knowledge of this file system mapping.

In a host write to the non-volatile memory device, the host issues a write command together with a range of logical sector addresses followed by the addressed logical sectors themselves. Similarly, in reading the memory device, the host issues a read command together with a range of logical sector addresses and the device responds by returning the addressed logical sectors to the host. A host write is dependent on the activity of the application generating the data, which is generally unpredictable. However, the host write could be categorized into two main categories: long sequential write; and short random write. The "long" and "short" are relative to the length of a run (sequential addresses) of logical sectors to be written in the context of the physical block size of the memory device.

On the other hand, the memory device has a different organization structure due to the physical characteristics and constraints of the flash memory device. First, a bank of sense amplifiers operating in parallel enables the memory to be read or written page by page (physical page). The page of memory cells could be constituted from several memory planes, each plane with its own set of sense amplifiers and the page is more specifically referred to as a "metapage". For example, a page may be formed across a row of memory cells in the memory array (which may include several planes) and may have 4 KB cells.

FIG. 2 illustrates a number of logical pages addressable by a host. For example a logical page 62, such as LP0, contains a chunk of 8 logical sectors in sequential order (LBA0, LBA1, . . . , LBA7). For expediency, a logical page is meant to be stored in a physical page of the memory.

When the host writes data to, or reads data from, the memory system, a controller within the memory system translates logical addresses received from the host into physical addresses within the memory array. The logical sectors of data are stored in the corresponding physical addresses in the memory. A logical to physical address table or map or directory is maintained by the controller to keep track of these address translations.

Thus, another issue related to the block architecture is the size of the logical to physical address map. A host writes or read units of data by their logical addresses. An example of a unit of data is a sector of 512 bytes. The flash memory system stores these units of data in some physical locations having their own physical addresses. Typically, data are stored page by page, with each page being one or more sectors. Thus, a map or directory is maintained by the memory system to enable a unit of data of a given logical address to be located physically in the memory.

The logical to physical address map is part of system control and directory data maintained to manage a flash memory system. The directory data is produced and accessed during the course of various memory operations. Thus, its efficient handling and ready access will directly impact performance. This type of system control and directory data is also stored in the flash memory itself since the flash memory is meant for storage and is nonvolatile. However, with an intervening file management system between the controller and the flash memory, the data cannot be accessed as directly and quickly. For example, if the directory data is stored in the flash memory, its access is itself subject to a directory lookup. Also, system control and directory data tends to be active and fragmented, which is not conducive to being stored in a system with a large size block.

Conventionally, this type of control and directory data is cached in the controller RAM, thereby allowing direct and speedy access by the controller. Typically, after the memory device is powered up, a process of initialization enables the flash memory to be scanned in order to compile the necessary system control and directory data to be placed in the controller RAM. This process takes time and requires sufficient controller RAM capacity, all the more so with ever increasing flash memory capacity.

Existing Page-Based Mapping

FIG. 3 illustrates a block partitioned into a plurality of physical pages. In a block 300, each physical page 72 is able to store a logical page 62. For read and write performance, the memory cells in a physical page 72 are read or written in parallel. The block 300 has N physical pages 72 for storing N logical pages 62 of data when each memory cell stores one bit of data. For memory cells that each stores M bits of data, then each physical page 72 will store M logical pages.

U.S. Pat. No. 6,567,307 discloses a method of dealing with sector updates among large erase blocks. Multiple blocks are set up as a scratch pad to store the update data. Garbage collection operations are performed to consolidate the valid sectors among the various blocks and rewrite the sectors into new blocks after rearranging them in logically sequential order. In this way, a block needs not be erased and rewritten at every slightest update. However, the logical to physical mapping is at a fine granularity at the sector or page level, which requires a large storage for such a map. As a copy of the map is preferably maintained in the controller RAM for fast access, a large map requires a large capacity controller RAM, which is expensive. Also, the fine granularity requires frequent updates of the map.

FIG. 4 illustrates an existing page-based block management scheme. Since the memory device writes page by page, the logical to physical map 23 will have to track each page. For example, the first host write, W1, writes logical pages LP0-LP255 into a current open block 20 starting from physical page P0. Each logical page contains one or more sectors addressable by LBAs. The second write, W2, writes an update of the logical page LP1 as logical page LP1' into physical page P256 which renders obsolete the previously written LP1 at page P1. The third write, W3, writes logical page LP301 into physical page P257. Eventually, when the current open block 20 is filled, it is relegated to a filled block pool 30 while a new current open block is allocated from the free block pool 40. When the free block pool 40 is short of free blocks, it obtains a new one from the filled block pool 30 by a garbage collection operation on a block containing obsolete pages.

Page-based mapping is optimized for a host write pattern in which the writes are mostly short, random writes of a few pages. However, tracking at the page level requires maintenance of a large-size map 23 as each block contains a large number of pages. Referencing the map stored in the flash memory during write and read operations is cumbersome and slow. It is preferable to work with a cached copy of the map in a controller RAM. However, the capacity of the controller RAM is limited and costly, and will be prohibitive to fit the entire map if it is at the page level. Thus, either a large and expensive controller RAM is required to hold the entire map or when the RAM is insufficient to hold the entire map, only a small portion of the map is in RAM and the remaining portion of the map is overlaid in flash memory. In the latter case, read performance is therefore compromised.

In any case, page-based systems tend to have the update data distributed over many blocks and the update data may render many existing blocks partially obsolete. The result often is a large amount of garbage collection necessary for the partially obsolete blocks, which is inefficient and causes premature endurance aging of the memory due to more frequent erase-cycling. Also, there is no systematic and efficient way of dealing with sequential update as compared to non-sequential update.

Existing Group-Based Mapping

One solution to the problem of a large-size map is solved by tracking the logical to physical mapping at a coarser, group-based level. Instead of tracking at the page level, a group of pages is tracked as a unit. The map can therefore be maintained at a logical group level.

FIG. 5 illustrates each block storing a logical group of data. For example, each logical group consists of 1000 logical pages. A logical group 330-0 (LG0) consists of logical pages LP0-LP999 stored in a block 300-0 such as Block0. A logical group 330-1 (LG1) consists of logical pages LP1000-LP1999 stored in another block 300-1 such as Block1. Unlike a logical page which contains one or a few logical units of data, each logical group contains multiple logical pages having a large number of logical units of data (one or two orders of magnitude larger) in sequential logical addresses. The sequential order means the pages within the group are self-indexed. For ease of operation, each logical group has a size that fills a block. Thus, it is sufficient for a group-level map, such as the group-level map 25 of FIG. 6, to track the physical block in which the logical group is in. Once the physical block is located, a given logical address within the logical group can be located by its sequential physical order in the block. In this way, the group-level map 25 has a size that can be substantially reduced. For example, if a logical group contains 1000 logical pages, the map size can be reduced roughly 1000 times compared to that of a page-level map.

In practice, a host does not always write in a large sequential chunk of data that corresponds neatly to a logical group that fills an entire block. Thus, blocks may also need to accommodate non-sequential order of logical pages as well as obsolete pages.

One existing way to avoid mixing of obsolete and non-obsolete pages in a block is to do a read-modify-write ("RMW"). At any time, the sequential order of the pages stored in a block is maintained. For example, a certain logical page in a logical group stored sequentially in a block is being updated. After the entire block of data is read into RAM, the certain logical page is updated in RAM and then the update block of data is rewritten from RAM to a new block. In this way, the logical to physical address mapping within a block is unchanged, only the physical block number need be updated. However, this method of update is inefficient, as it requires an entire block to be rewritten, even if the data to be updated only occupies a small portion of the block. It will also result in a higher frequency of garbage collection among the memory blocks, which is undesirable in view of the limited endurance of this type of memory device.

One solution to avoid RMW in a group-based architecture is to write to a mixture of sequential and non-sequential (chaotic) blocks. Flash memory with a block management system employing a mixture of sequential and chaotic update blocks is disclosed in United States Patent Publication No. US-2005-0144365-A1 dated Jun. 30, 2005, the entire disclosure of which is incorporated herein by reference. The goal is to store the host writes in logical groups consisting of a large number of logical sectors or pages in sequential order in a block. To make garbage collection simple, the logical group size is aligned to an erase block so that each block is filled by one logical group. In this way, the logical to physical map is at the logical group level with a much reduced size of the map and corresponding capacity of the controller RAM.

FIG. 6 illustrates an existing group-based block management scheme. The goal is to store the host writes in logical groups, one logical group per block. Each logical group consists of a large number of logical sectors or logical pages in sequential order. In this way, the logical to physical map is at the logical group level (rather than at the page level), resulting in a much reduced size of the map and corresponding capacity required for the controller RAM. To limit the scope of the logical addresses in a garbage collection, each block is filled by one logical group. For example, the logical group LG0 exactly fills the block 20-1.

As described earlier, the host addresses sectors of data by assigning each with a logical address, LBA. For example, the address space of the host, LBA0, LBA1, LBA2, . . . is partitioned into logical groups each having 1000 LBAs so that LG0 contains LBA0-LBA999, LG1 contains LBA1000 to LBA1999, etc. The sectors of sequential LBAs are packed into logical pages, LP0, LP1, LP2, . . . . In one example, the logical page is the size of one sector. In another example, the logical page is the size of more than one sector. Each logical page is stored in one of physical pages, P0, P1, P2, . . . of the memory. The physical page is a group of memory cells that are operated together in a read or write operation. For example when each logical page is one sector, in a first write, W1, LBA0-LBA999 are written and thus the logical group LG0 is written with logical pages LP0-LP999 respectively filling physical pages P0-P999 of an entire block 20-1.

The host in its various writes can involve LBAs from different logical groups. When a logical group is involved the first time, a "sequential" block dedicated to that logical group such as block 20-1 is opened to store the logical pages in sequential order. In practice, there could be logical pages from multiple logical groups being written concurrently and interleavingly. Thus multiple sequential blocks are opened concurrently to store the logical pages from the respective logical groups.

When a host write is not writing in large segments of logical pages in sequential order, it is written to an update block dedicated to each logical group. The "update" block (also known as a "chaotic" block) is also allocated to each logical group to store the "chaotic" fragmented writes and updates associated with the logical sectors or pages of that logical group. Thus, each active logical group has two blocks allocated to it. A first sequential block for writing sequentially and a second update block for writing chaotically. For example, in a second write, W2, a single LBA is written as LP1' to update the existing LP1. This update is written to P0 of a dedicated update block 20-2 for the logical group LG0. The previously written LP1 in P1 of sequential block 20-1 is then rendered obsolete. In a third write, W3, another single LBA is written as LP301 to P1 of the update block 20-2.

Eventually, a garbage collection will consolidate the valid logical sectors or pages of that logical group. It will involve copying data between the logical group's pair of sequential and update blocks to end up with a single block. While storing logical group by logical group helps to reduce the size of the map, an additional map is required to track the chaotic update block at the page level. As noted above, for N open logical groups, in addition to N sequential blocks, there will also be N chaotic update blocks to track. Furthermore, as noted, each chaotic or update block must eventually be consolidated by garbage collection logical group by logical group, requiring quite a bit of copying of data between each pair of sequential and update blocks. This scheme requires keeping track of a large number of open blocks and is complicated to manage.

Thus, group based mapping will reduce the logical to physical map size of the sequential blocks but still have to contend with tracking at the page level for every chaotic or update blocks associated with each logical group opened for writes. So while the map size is reduced compared to a purely page-based mapping, it still places a limit on the number of logical groups that can be open simultaneously for writes. In general, group-based mapping is optimized for writes or reads of large chunks of sequential data but suffers from very poor random write performance. Furthermore, a write may be "amplified" by having the same data being copied or re-written multiple times over the course of consolidation and garbage collection, which is inefficient.

Therefore there is a general need for high capacity and high performance non-volatile memory. In particular, there is a need to have a high capacity nonvolatile memory able to conduct memory operations in large blocks without the problems of having to have a large controller RAM to hold a large logical to physical map and without the problem of rewriting data multiple times for consolidation and the need for frequent garbage collections.

SUMMARY OF THE INVENTION

According to a general aspect of the invention, a non-volatile memory is organized into blocks as erase units and physical pages as read/write units, each block containing multiple physical pages of memory cells. A host addresses data by logical pages, which are storable in corresponding physical pages. Groups of logical pages are further aggregated into logical groups as addressing units. The memory writes host data in either first or second write streams, writing to respective blocks either logical group by logical group or logical page by logical page in order to reduce the size of logical to physical address maps that are cached in a controller RAM.

The first write stream has a pool of open blocks for attempting to store data logical group by logical group and is tracked by a group-level map. The second write stream has blocks for storing data logical page by logical page and is tracked by a page-level map. Data from a host write is written to the first stream when it has at least a predetermined size or its logical addresses follow sequentially to a previous write in a partially filled block in the first stream. Otherwise, the data is written to the second write stream.

The predetermined size is preferably adapted to an expected host write pattern. When data from a host write has at least the predetermined size, it is written to the first write stream. If its starting logical address follows sequentially to a previous write in a partially filled block in the first stream, it is appended there. If it does not, a new block is allocated to the first write stream to receive it. In principle, the predetermined size is such that it is conducive to writing the blocks in the first write stream logical group by logical group without the need to allocate a new block beyond a predetermined frequency. In one embodiment, the predetermined size is set to 64 KB.

The group-level map tracks the physical locations of the logical groups in a block in the first stream. The page-level map tracks the physical locations of any obsolete logical pages among the logical groups and the locations of the updated logical pages.

In a preferred embodiment, the group-level map includes a flag for each logical group to indicate whether or not the logical group contains an obsolete logical page. When the flag indicates that the logical group contains an obsolete logical page, the page-level map is used to locate any obsolete logical pages in the logical group and the corresponding updated logical pages.

An open block in the pool of open blocks in the first stream can be removed from the pool to make room for a new one in one of two ways. In the first way, the block is converted from the first stream to the second stream. This is when the data on the block is out of sequence and can no longer be stored logical group by logical group. In the second way, the block is full and placed in a filled block pool. Similarly a filled block in the second stream is placed in the filled block pool and replaced by a new block.

The filled block pool contains filled blocks from the first and second streams. Free blocks are reclaimed from the filled block pool by garbage collection on selected blocks containing excessive obsolete data. The garbage collection will erase a selected block from a given write stream after salvaging the valid pages to another block in the given stream. The reclaimed blocks are added to a pool of erase blocks which can then be allocated as blocks in the first write stream and in the second write stream. Thus, the controller performs garbage collection independently on each of the first and second write streams. Data need not be copied between the first and second write streams.

In one embodiment, individual memory cells are each configured to store one bit of data. In another embodiment, individual memory cells are each configured to store more than one bit of data.

According to another aspect of the invention, a method of operating a non-volatile memory, includes organizing the non-volatile memory into blocks of memory cells that are erasable together, each block for storing a plurality of physical pages, each physical page for accessing a predetermined number of logical units of data in parallel, each logical unit having a logical address assigned by a host; providing a plurality of logical groups provided by partitioning a logical address space of the host into non-overlapping groups of sequential logical addresses; writing the data from a host write either to a first write stream or, otherwise, to a second write stream; providing a pool of erase blocks for allocating multiple blocks in the first write stream, each of the multiple blocks being open in parallel in the first write stream for writing logical group by logical group, and for allocating blocks sequentially in the second write stream, each of the blocks being open one at a time for writing logical page by logical page; responsive to the data having at least a predetermined size or its logical addresses following sequentially a previous write in a partially filled block in the first stream, for writing the data to the first write stream, otherwise, for writing the data to the second write stream; tracking with a group-level map logical groups stored among the plurality of blocks in the first write stream, said group-level map being maintained in said non-volatile memory with a copy cached in a random-access memory ("RAM") of said controller; tracking with a page-level map obsolete pages among the logical groups written in the first write stream and updated pages of the obsolete pages written in the first and second write streams, said page-level map being maintained in said non-volatile memory with at least a portion of a copy cached in the RAM of said controller; and performing garbage collection independently on each of the first and second write streams without data being copied between each of the first and second write streams.

The present invention has the following, features and advantages. Storing a large portion of the host data at the logical group level allows a relatively smaller-size map that can be cached entirely in the controller RAM. At the same time, short random host writes are stored at the logical page level with a minimum of open blocks. This scheme enables more flexibility in block resource allocation and simpler block management. Furthermore, "write amplification" in terms of additional copying of data among the blocks due to garbage collection is minimized as garbage collection is performed on the blocks from each write stream independently without data copying between the two streams.

More specifically, by having the logical group size adjusted to depend on expected pattern of host writes, more of the host write data could be stored in the first write stream logical group by logical group. At the same time, the disadvantage and complications of conventional hybrid group- and page-level mapping schemes that require dedicated blocks for each logical group and consolidation and rewrites of data between the group-level and page level blocks are also avoided.

Since there is only one pool of erased block that is shared between the first and second write streams, the number of spare blocks can be reduced compared to prior schemes, thereby reducing the die size. On the other hand, if the number of spare blocks are kept the same as prior schemes, there will be more blocks for a recycling process during garbage collection. This will improve recycling efficiency and help to reduce endurance wear.

Other advantages include a simpler design, which can save developing cycle and CPU bandwidth. Also, unlike prior schemes, eviction process from single-level cell ("SLC") to multi-level cell ("MLC") memory portion is avoided, padding of data is not required and garbage collection is simplified as the two write stream are handled independently. All in all, the invention results in a simpler and lower-cost memory with better performance.

Additional objects, features and advantages of the present invention will be understood from the following description of its preferred embodiments, which description should be taken in conjunction with the accompanying drawings.

DETAILED DESCRIPTION

Memory System

Figure 7:
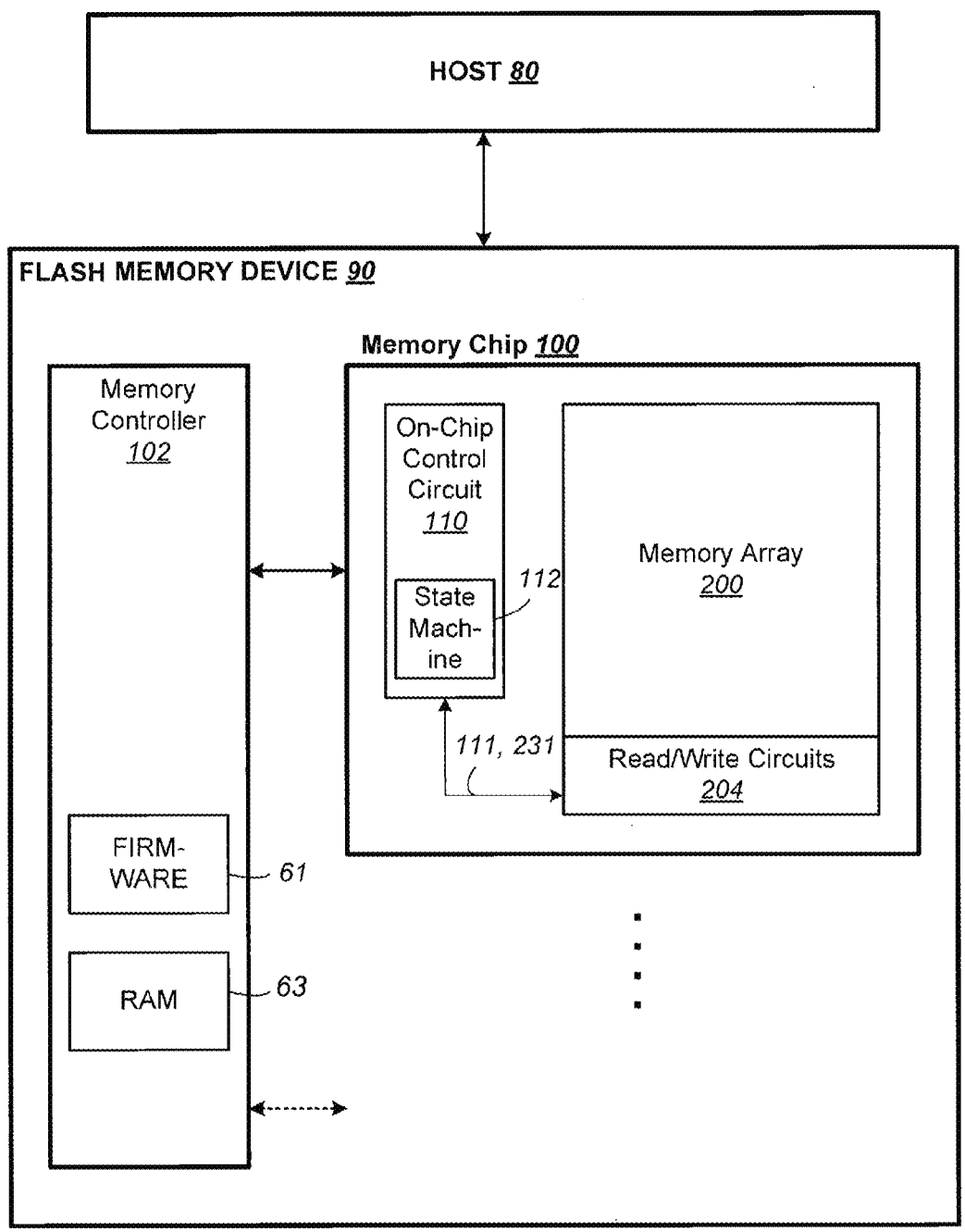
FIG. 7 illustrates a host and a memory device, according to an embodiment.

FIG. 7 illustrates a host and a memory device in which the features of the present invention are embodied. A host 80 is in communication with the memory device 90. The host 80 typically sends data to be stored at the memory device 90 or retrieves data by reading the memory device 90. The memory device 90 includes one or more memory chips 100 managed by a memory controller 102. The memory chip 100 includes a memory array 200 of memory cells with each cell capable of being configured as a multi-level cell ("MLC") for storing multiple bits of data, as well as capable of being configured as a single-level cell ("SLC") for storing 1 bit of data. The memory chip 100 also includes read/write circuits 204 such as row and column decoders, sense modules, data latches and I/O circuits. An on-chip control circuitry 110 controls low-level memory operations of each chip. The control circuitry 110 is an on-chip controller that cooperates with the read/write circuits 204 to perform memory operations on the memory array 200. The control circuitry 110 typically includes a state machine 112 to provide chip level control of memory operations via a data bus 231 and control and address bus 111.

In many implementations, the host 80 communicates and interacts with the memory chip 100 via the memory controller 102. The controller 102 cooperates with the memory chip 100 and controls and manages higher level memory operations. A firmware 61 provides codes to implement the functions of the controller 102. A RAM 63 provides the memory space of the software operations of the controller.

For example, in a host write, the host 80 sends data to be written to the memory array 200 in logical sectors allocated from a file system of the host's operating system. A memory block management system implemented in the controller 102 stages the sectors and maps and stores them to the physical structure of the memory array 200. A preferred block management system is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements are read or programmed together. In existing memory architectures, a row typically contains several interleaved physical pages or it may constitute one physical page. All memory elements of a physical page will be read or programmed together.

Figure 8:
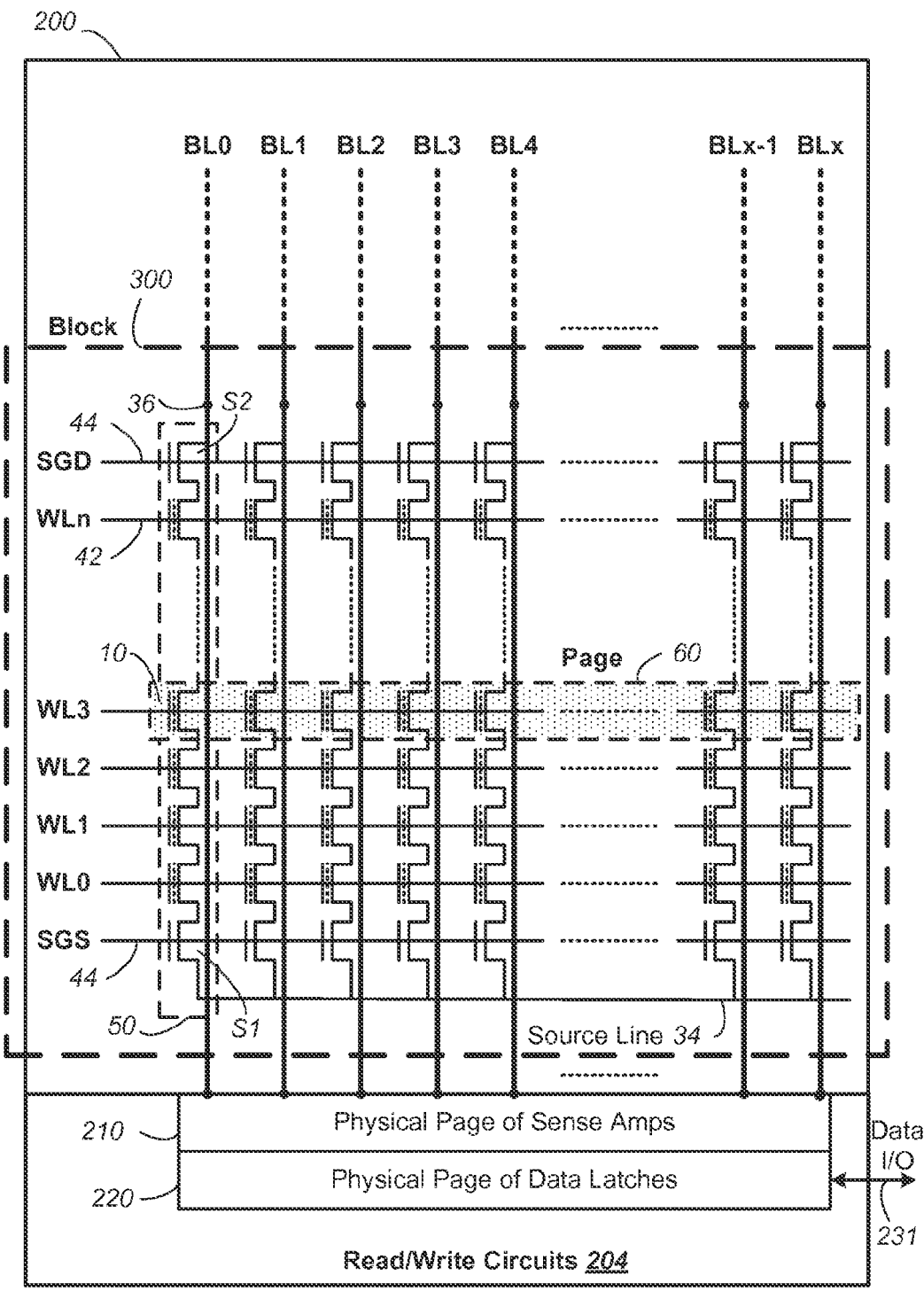
FIG. 8 illustrates a physical page of memory cells, organized, for example, in the NAND configuration, which can be sensed or programmed in parallel.

FIG. 8 illustrates a physical page of memory cells, organized, for example, in the NAND configuration, which can be sensed or programmed in parallel. FIG. 8 essentially shows a bank of NAND strings 50 in the memory array 200 of FIG. 7. A "page," such as the page 60, is a group of memory cells enabled to be sensed or programmed in parallel. This is accomplished in the read/write circuits 204 by a corresponding page of sense amplifiers 210. The sensed results are latches in a corresponding set of data latches 220. Each sense amplifier can be coupled to a NAND string, such as NAND string 50 via a bit line 36. For example, the page 60 is along a row and is sensed by a sensing voltage applied to the control gates of the cells of the page connected in common to the word line WL3. Along each column, each cell or transistor, such as cell or transistor 10, is accessible by a sense amplifier via a bit line 36. Data in the data latches 220 are toggled in from or out to the memory controller 102 via a data I/O bus 231.

The page referred to above is a physical page of memory cells or sense amplifiers. Depending on context, in the case where each cell is storing multi-bit data, each physical page has multiple data pages (1-bit data pages).

The NAND string 50 is a series of memory transistors 10 daisy-chained by their sources and drains to form a source terminal and a drain terminal, respectively, at its two ends. A pair of select transistors S1, S2 controls the memory transistors chain via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

Binary or Single-Level (SLC) and Multi-Level (MLC) Memory Cells

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory state for a memory cell. The multiple memory states can be coded by one or more binary bits. In the case the memory is configured as binary memory, the margin of operation is wider than that of MLC.

Erase Blocks

One important difference between flash memory and other types of memory is that a cell must be programmed from the erased state. That is, the floating gate must first be emptied of charge. Programming then adds a desired amount of charge back to the floating gate. It does not support removing a portion of the charge from the floating gate to go from a more programmed state to a lesser one. This means that update data cannot overwrite existing data and must be written to a previous unwritten location.

Furthermore, erasing empties all the charges from the floating gate and generally takes appreciable time. For that reason, it will be cumbersome and very slow to erase cell by cell or even physical page by physical page. In practice, the array of memory cells is divided into a large number of blocks of memory cells. As is common for flash EEPROM systems, the block is the unit of erase. That is, each block contains the minimum number of memory cells that are erased together.

Figure 9:
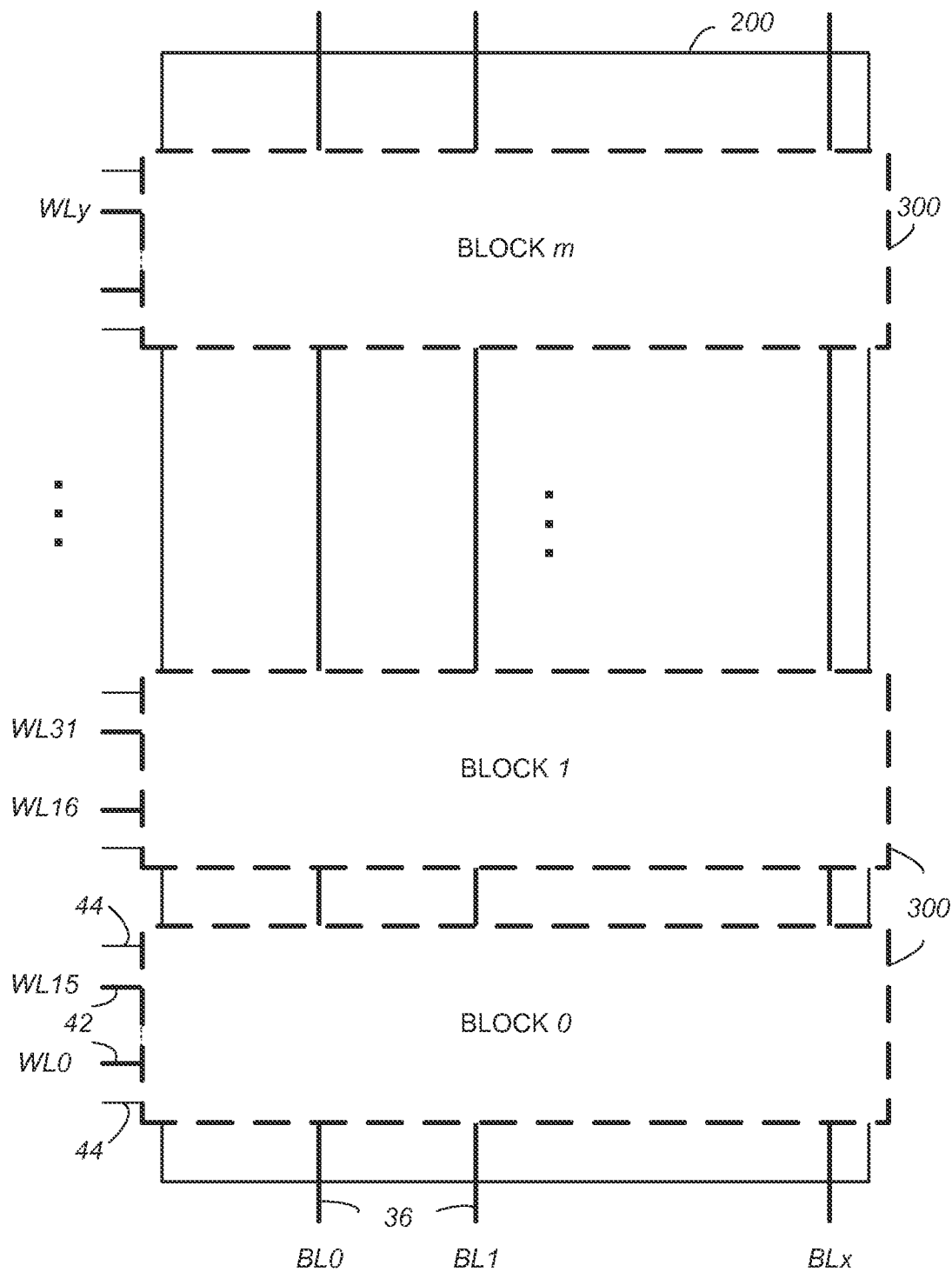
FIG. 9 illustrates schematically an example of a memory array organized in erasable blocks.

FIG. 9 illustrates schematically an example of a memory array organized in erasable blocks. Programming of charge storage memory devices can only result in adding more charge to its charge storage elements. Therefore, prior to a program operation, existing charge in a charge storage element of a memory cell must be removed (or erased). A non-volatile memory such as EEPROM is referred to as a "Flash" EEPROM when an entire array 200 of cells, or significant groups of cells of the array, is electrically erased together (i.e., in a flash). Once erased, the group of cells can then be reprogrammed. The group of cells erasable together may consist of one or more addressable erase unit or block 300. The erase unit or block 300 typically stores one or more physical pages of data, the physical page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

In the example shown in FIG. 9, individual memory cells in the memory array 200 are accessible by word lines 42 such as WL0-WLy and bit lines 36 such as BL0-BLx. The memory is organized into erase blocks, such as erase blocks 0, 1, . . . m. If the NAND string 50 (see FIG. 8) contains 16 memory cells, then the first bank of NAND strings in the array will be accessible by select lines 44 and word lines 42 such as WL0 to WL15. The erase block 0 is organized to have all the memory cells of the first bank of NAND strings erased together. In memory architecture, more than one bank of NAND strings may be erased together.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks may be logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

Block Management System

As described earlier, owing to the difference in structures and constraints between the host and the memory, the host's logical addresses cannot be simply mapped directly to the memory's physical addresses. It has to go through a block management system with a translation table or directory map in the memory controller to place the host write into the physical memory units of the flash memory. In particular, the block management system has to convert the random host write to sequential-like write on the flash memory and manages various aspects of block operations.

Figure 10:
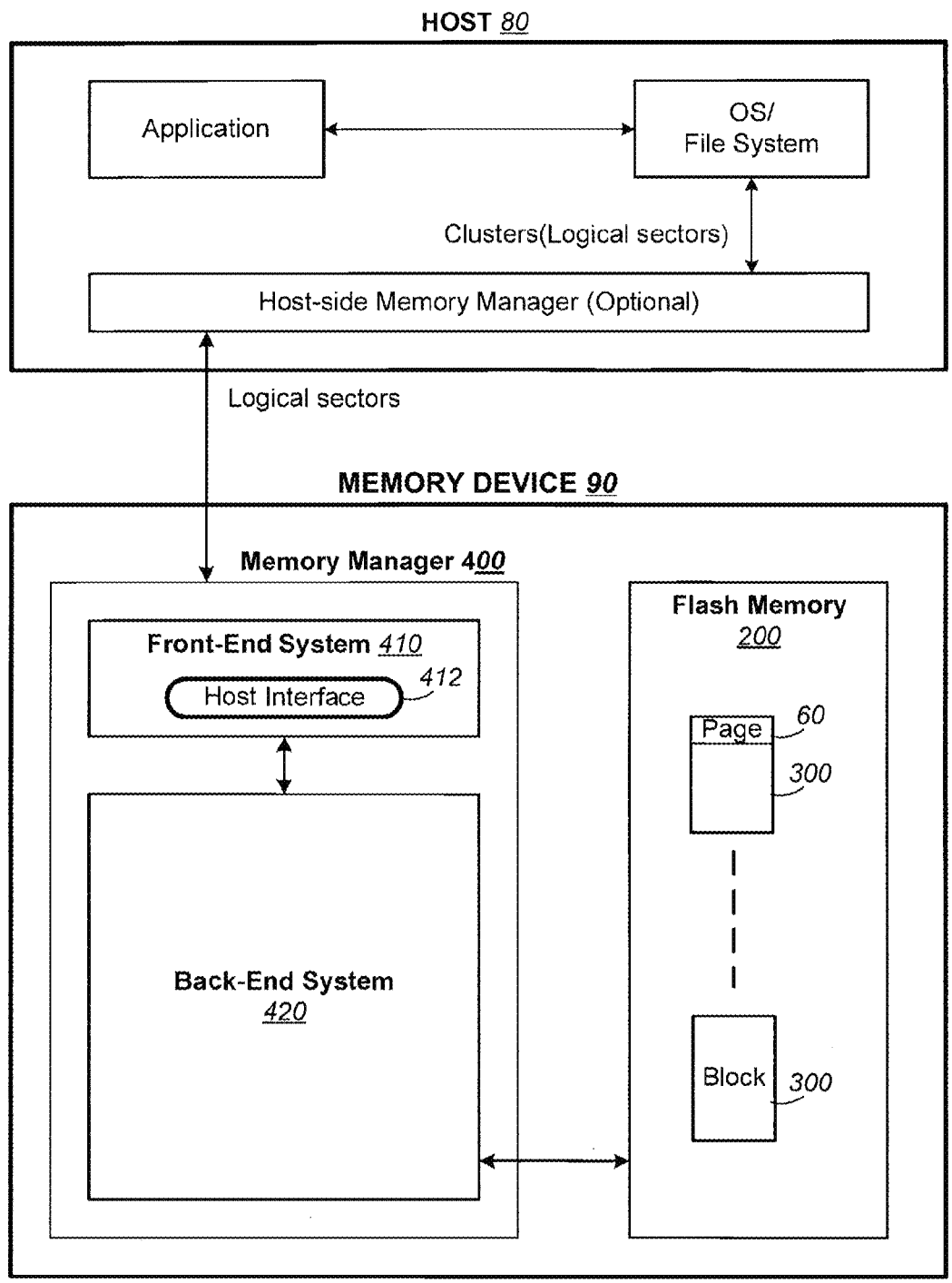
FIG. 10 illustrates a host and memory system with, for example, memory being managed by a memory manager, which is a software component that resides in the controller.

FIG. 10 illustrates memory being managed by a memory manager 400, which is a software component that resides in the controller. The memory array 200 is organized into blocks, each block of cells being a minimum unit of erase. Depending on implementation, the memory device 90 may operate with even larger units of erase formed by an aggregate of blocks into "metablocks".

The host 80 accesses the memory array 200 when running an application under a file system or operating system. Typically, the host system addresses data in units of logical sectors where, for example, each sector may contain 512 bytes of data. Each logical sector has an LBA. Also, it is usual for the host to read or write to the memory device 90 in units of logical clusters, each consisting of one or more logical sectors. In some host systems, an optional host-side memory manager may exist to perform lower level memory management at the host. In most cases during read or write operations, the host 80 essentially issues a command to the memory device 90 to read or write a segment containing a string of logical sectors of data with contiguous addresses.

The memory manager 400 performs the function of the block management system. It is implemented in the controller 102 (see FIG. 7) of the memory device 90 to manage the storage and retrieval of the data of host logical sectors among memory pages 60 in memory blocks 300 (or metablocks) of the flash memory 200. The memory manager 400 comprises a front-end system 410 and a back-end system 420. The front-end system 410 includes a host interface 412. The back-end system 420 includes a number of software modules, including a block management system for managing erase, read, and write operations of the blocks. The memory manager 400 also maintains system control data and directory data associated with its operations among the flash memory 200 and the controller RAM 63 (see FIG. 7).

The memory manager 400 is preferably implemented in the controller 102 (see FIG. 7). It translates logical addresses received from the host 80 into physical addresses within the memory array, where the data are actually stored, and then keeps track of these address translations.

Figure 1:
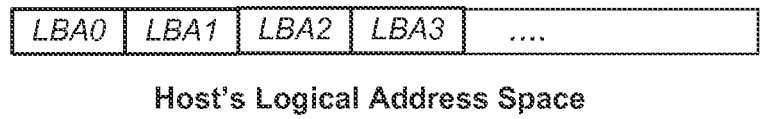
FIG. 1 illustrates schematically the logical address space of a host operating system.
Figure 2:
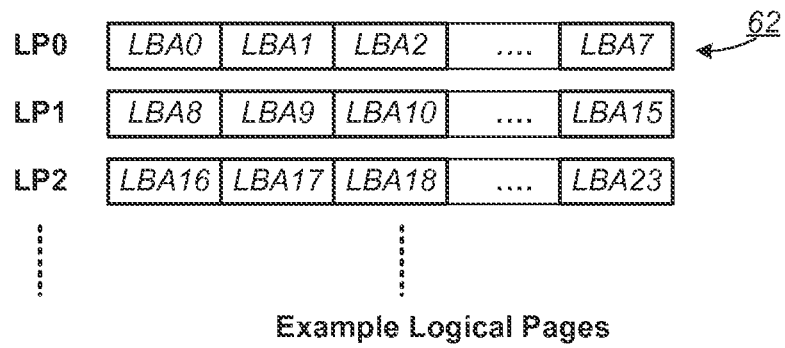
FIG. 2 illustrates a number of logical pages addressable by a host.
Figure 3:
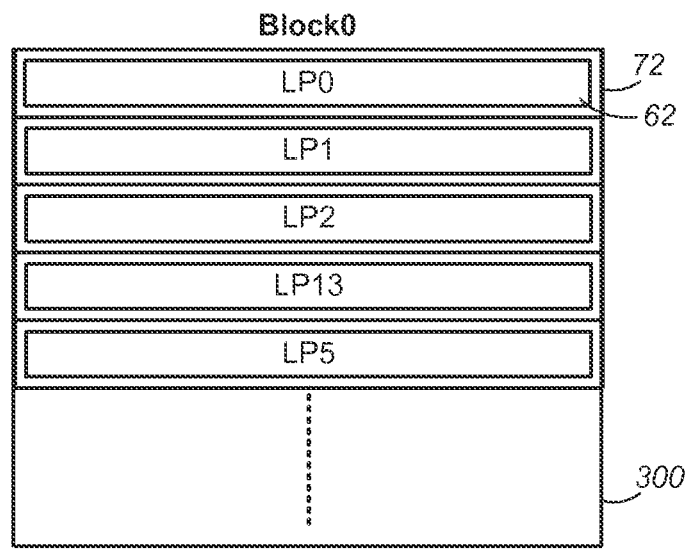
FIG. 3 illustrates a block partitioned into physical pages.
Figure 4:
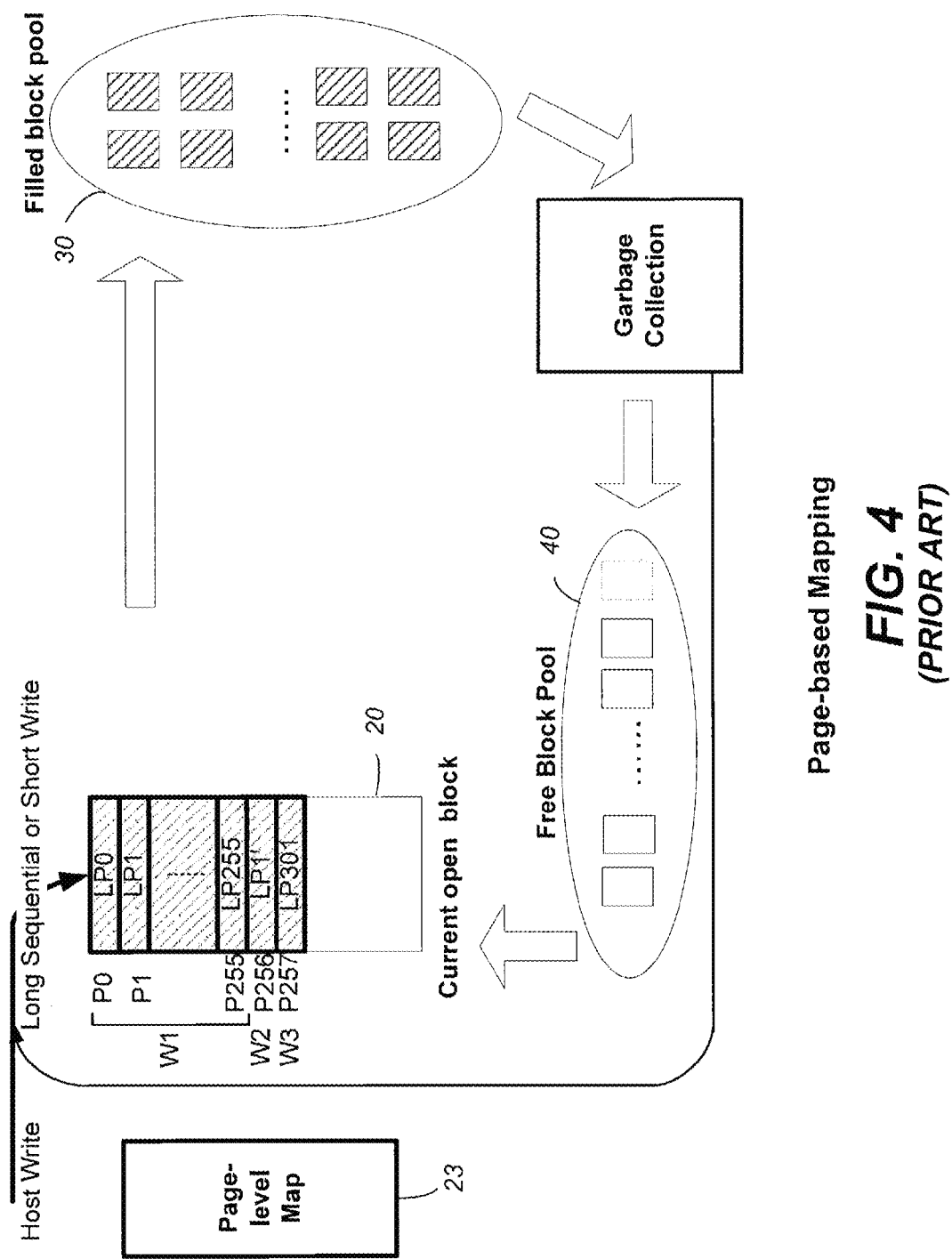
FIG. 4 illustrates an existing page-based block management scheme.
Figure 5:
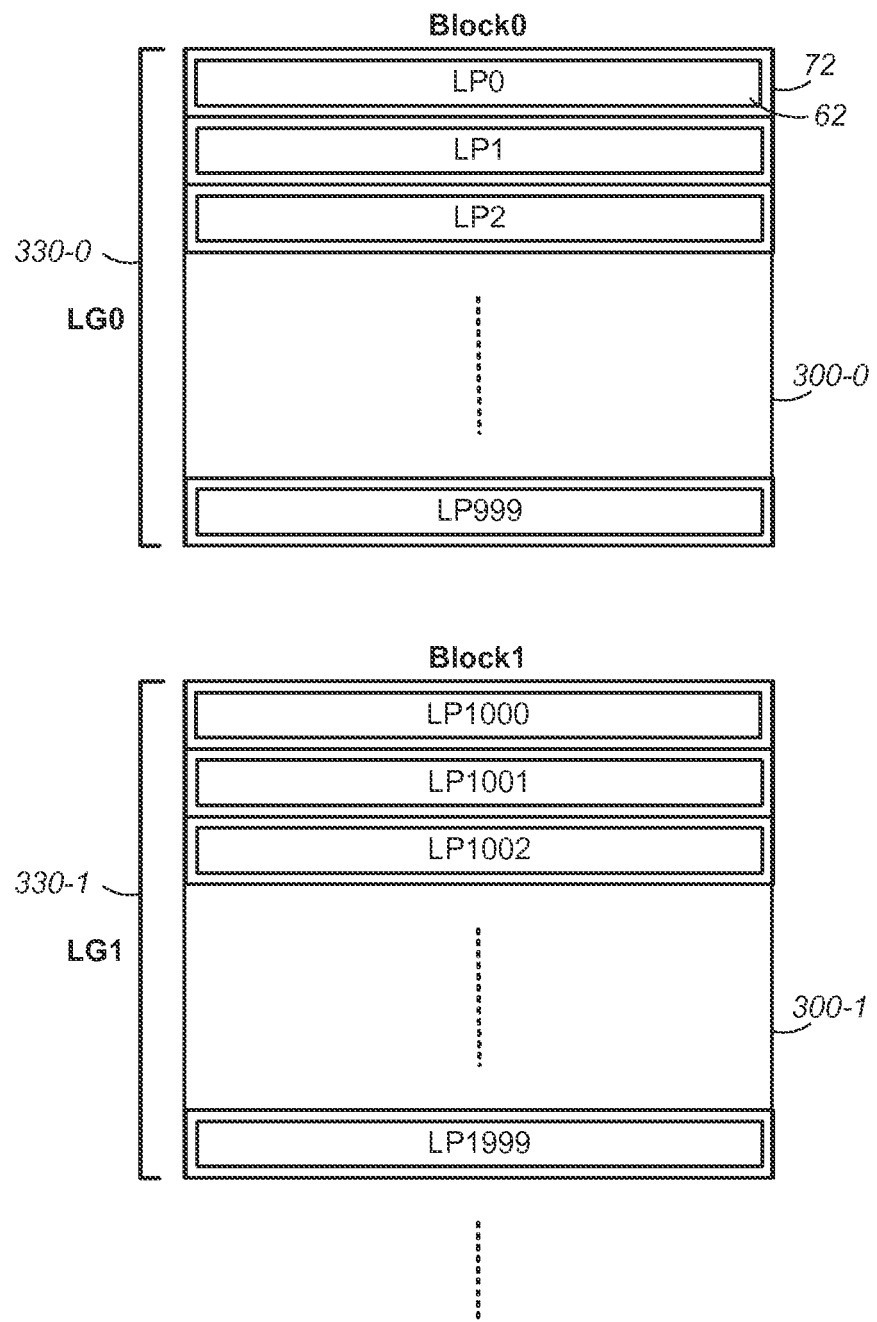
FIG. 5 illustrates each block storing a logical group of data.
Figure 6:
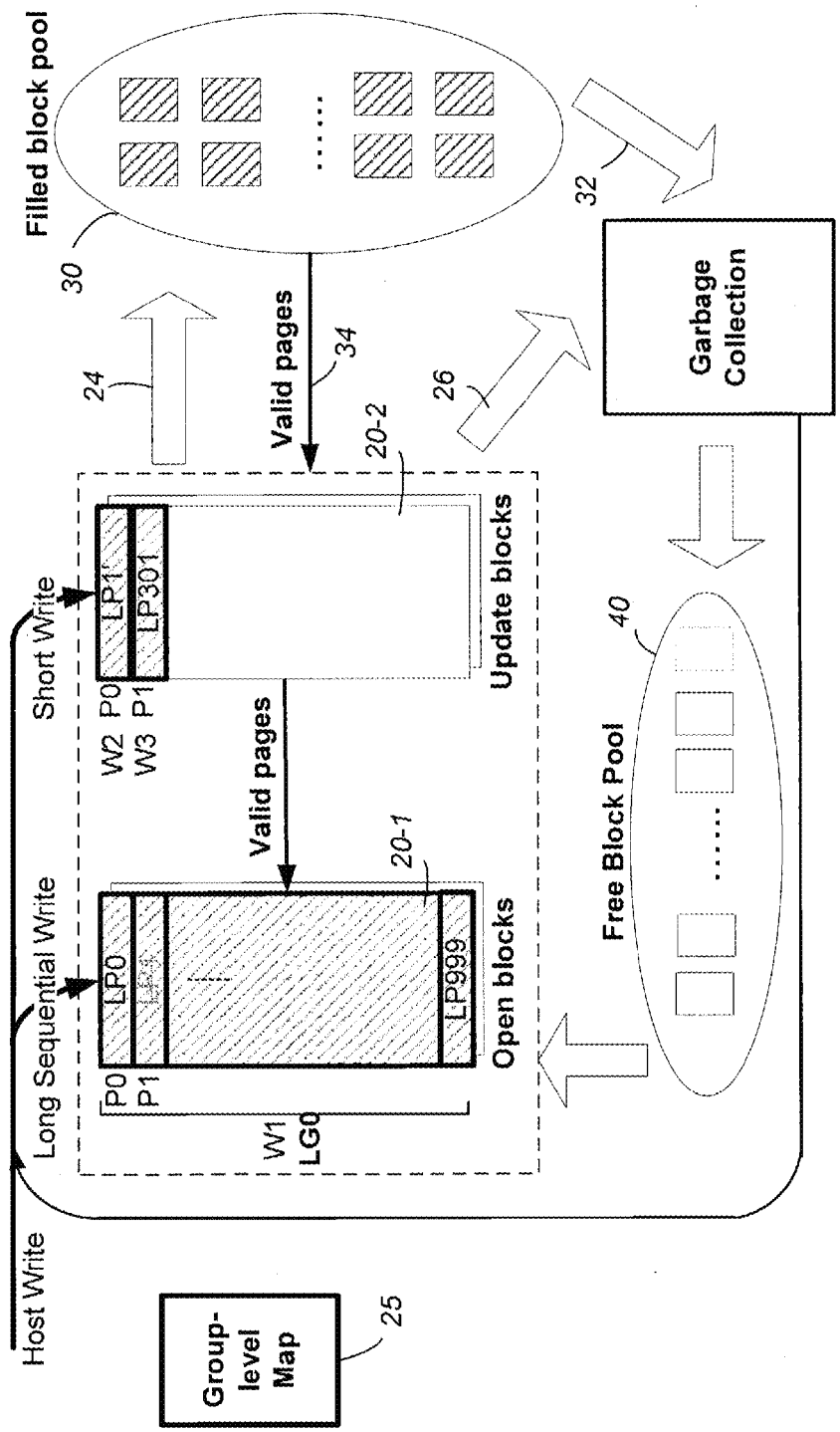
FIG. 6 illustrates an existing group-based block management scheme.

It has been described in the background section that there are two existing block management schemes. For example, FIG. 4 illustrates a page-based mapping in which a series of host writes in a single write stream fills up one block after another block. When a block has accumulated more than a predetermined number of obsolete logical pages, it will be garbage-collected. The resultant logical to physical address map is tracking at the logical page level and is therefore of necessary large size and would require a very expensive, large-capacity controller RAM to cache it. Alternatively, FIG. 6 illustrates a group-based mapping in which the logical addresses of the host are partitioned in logical groups. The logical pages within each logical group fit neatly within a block and are tracked as a single entity, resulting in a much smaller map. There are two write streams directed to two dedicated blocks opened for each logical group that is being written concurrently. When the host write for a given logical group is sequential in logical address, it is written in the first write stream to a sequential block for that logical group. When the host write for that logical group is non-sequential or chaotic, it is written in the second write stream to a chaotic update block for that logical group. So at any time, there may be many write streams writing to many open blocks. The number of open blocks are kept under a maximum number by consolidating a pair of blocks for a logical group into a filled sequential block in order to reduce the number of concurrently open logical groups.

Adaptive Logical Group Mapping

According to a general scheme of the invention, a non-volatile memory is organized into blocks, each block for storing multiple logical pages of data that are block-erasable. Two types of blocks are provisioned for respectively writing in two separate write streams. The first write stream contains blocks of the first type ("LG blocks"), which store data logical-group by logical-group, where each logical group is a group of logical pages in sequential order of logical addresses. The second write stream contains blocks of the second type ("LP blocks"), which store data logical-page by logical-page. In a series of host writes, each host write is adaptively written either to an LG block in the first stream or to an LP block in the second stream. The LP blocks require a page-level map to track the location of the logical pages in the LP blocks. On the other hand, the LG blocks need a group-level map of much reduced size to track the location of the logical groups among the LG blocks. After one or more logical pages of a logical group stored in an LG block has been updated by storing those updated logical pages in a LP block, the page-level map is also used to keep track of those updated logical pages as well as the corresponding obsoleted logical pages in the LG block.

The use of LG blocks in the first write stream will alleviate the capacity requirement of a controller RAM needed to cache the maps. The use of LP blocks in the second write stream will take care of the short, random host writes. Moreover, compared to existing schemes, the present scheme is much simplified with the second write stream needing only one open block at a time. Also, data in the blocks of the two streams need not mix as operations such as consolidations and garbage collection in each stream are performed independently. This allows for greater flexibility and economy. In contrast, prior group-based schemes have many more write streams, basically each active logical group must have a pair of blocks open to receive sequential and non-sequential writes respectively. For that reason they demand more block resources and require consolidation and garbage collection of data between each pair of blocks on a logical-group by logical-group basis.

Figure 11:
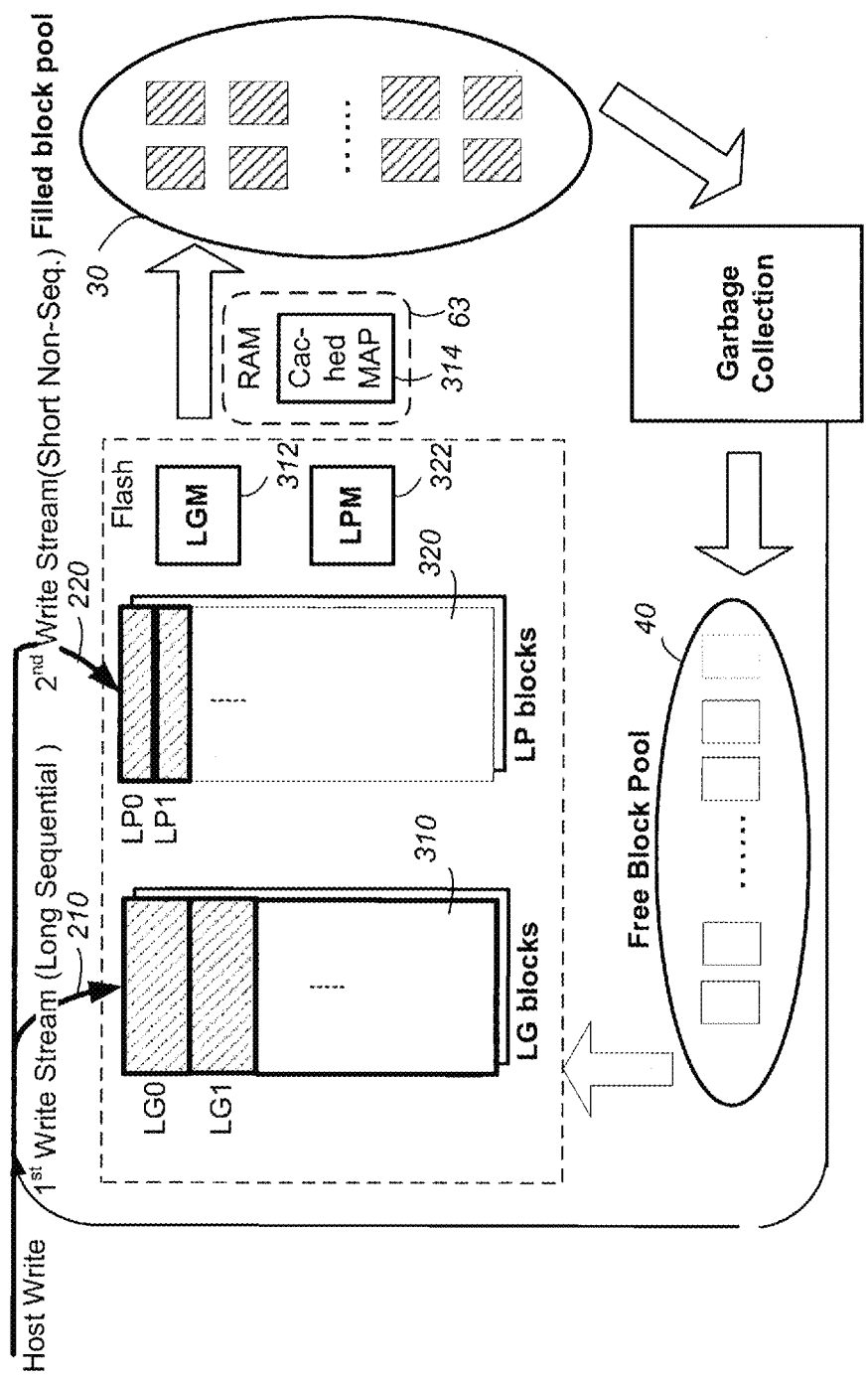
FIG. 11 illustrates an adaptive group-based block management scheme, according to a preferred embodiment of the invention.

FIG. 11 illustrates an adaptive group-based block management scheme, according to a preferred embodiment of the invention. A host write is directed to either a first write stream 210 or to a second write stream 220. The memory manager 400 (see FIG. 10) inspects the incoming host write and, based on the logical addresses of the data to be written, determines if the write is a long sequential write or a short non-sequential write. When the host write is a long sequential write, it is directed to a LG block 310 in the first write stream 210. When the host write is non-sequential, it is directed to a LP block 320 in the second write stream 220.

Figure 12:
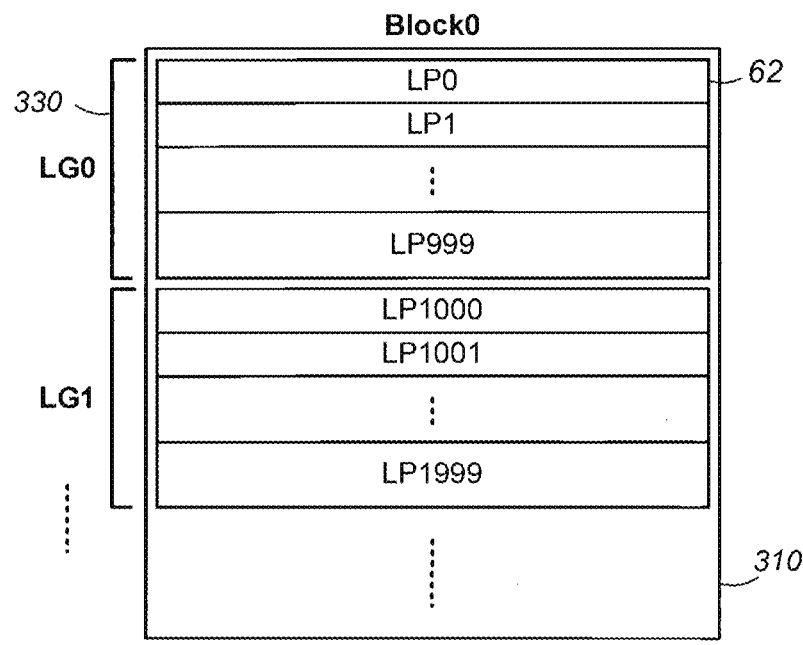
FIG. 12 illustrates multiple logical groups stored in a logical group ("LG") block.

FIG. 12 illustrates multiple logical groups stored in a LG block. Data is being stored in a LG block 310 as entire logical groups 330, such as LG0, LG1, . . . . In the example shown in FIG. 12, each LG block stores multiple logical groups and each logical group contains 1000 logical pages 62.

Figure 13:
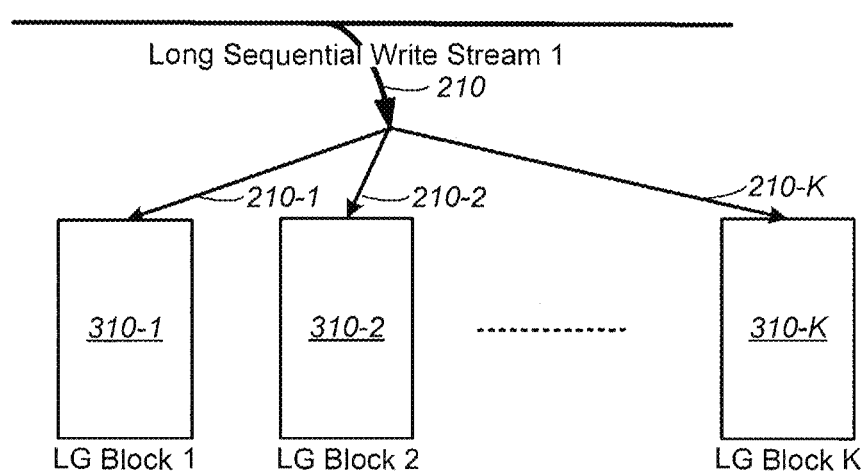
FIG. 13 illustrates a preferred embodiment of implementing the first write stream in which multiple LG blocks are open to receive host writes concurrently.

FIG. 13 illustrates an example of the first write stream in which multiple LG blocks are open to receive host writes concurrently. Essentially, first write stream 210 is further branched out into K sub-streams, such as 210-1, 210-2, . . . , 210-K, one for each open LG block, such as LG block 1 310-1, LG block 2 310-2, . . . , LG block K 310-K.

Referring again to FIG. 11, the LG block 310 and LP block 320 are memory blocks of the memory array 200 (see FIG. 7). Both of them are allocated from a free block pool 40. Typically, multiple LG blocks are open concurrently in the first write stream to store data from host writes logical-group by logical group, and at least one LP block at a time is open in the second stream to store data logical-page by logical-page (see FIG. 11).

When a block from either stream is full, it is relegated to a filled block pool 30. Also, when a LG block from the first stream is closed, it is relegated to the filled block pool 30.

The filled block pool 30 contains filled blocks from the first and second streams. Free blocks are reclaimed from the filled block pool 30 by garbage collection on selected blocks containing excessive obsolete data. The garbage collection will erase a selected block from a given write stream after salvaging the valid pages to another block in the same given stream. Thus, the controller performs garbage collection independently on each of the first and second write streams. Data need not be copied between the first and second write streams.

The reclaimed blocks are added to the free block pool 40. New erase blocks are allocated from the free block pool 40 to the first write stream and the second write stream.

An open LG block 310 in the pool of open blocks in the first stream 210 can also be removed from the pool when the open LG block 310 is converted from a block in the first stream to a block in the second stream. This is when the data in the open LG block 310 is out of sequence and can no longer be stored logical-group by logical-group. Then the open LG block 310 is converted to an open LP block 320 in the second stream 220. No additional copying of data between blocks is needed. The conversion only requires an update of the logical to physical maps.

The data written into LG blocks 310 in the first write stream 210 is tracked at the logical-group level with a relatively smaller-size logical-group-level map ("LGM") 312. The disadvantage of a large-size map due to only page-level storing blocks is avoided. This only leaves LP blocks 320 in the second write stream 220 storing short and random host writes, logical page by logical page, to be tracked at the page-level with a relatively larger-size map ("LPM") 322. This results in an overall reduction in map size in which the entire LGM 312 and at least a portion of the LPM 322 may be included in a cached map 314 cached in the controller RAM 63. The LGM 312 and LPM 322 are also maintained in the nonvolatile memory 200.

The memory manager 400 inspects the data of the incoming host write and deems it to be a "long sequential" write if it is conducive to be written to a LG block so that eventually an entire logical group will be written. In particular the host write is a long sequential one if one of the following is satisfied:

(i) its starting logical address is at the start of a logical group;

(ii) its starting logical address follows the last logical address written in an open LG block;

(iii) it is at least of a predetermined size. For example, it is at least of a 64 KB chunk size. If the size of a logical page is 4 KB, then it is at least 16 logical pages.

An example of a series of host writes writing into either first or second write stream will illustrate how the two write streams operate.

Logical Addresses

LBA=host address of logical unit, such as a sector of 512 bytes.

LP=logical page consisting of 8 LBAs (4 KB).

LG=logical group consisting of 1K LPs (8K LBAs or 4 MB).

Physical Addresses

P0-P1999=2000 physical pages in a block.

Block=physical erase block of 8 MB consisting of 256 physical pages.

Therefore, each physical page stores 1 LP, and each block stores 2048 LPs or 2 LGs.

Maps (Logical to Physical Addresses)

LGM=Logical Group-level map tracking the physical location of LG. It is maintained in non-volatile memory and is also cached in the controller RAM.

LPM=Logical Page-level map tracking the physical location of LP. It is maintained in non-volatile memory and at least a portion is also cached in the controller RAM if there is room.

Cached Map is in the Controller RAM containing a cached copy of LGM and at least a portion of the latest changes in LPM.

The long sequential write is written to a LG block in the first write stream. The host write is deemed "short non-sequential" if it does not qualify as "long sequential" as defined above.

1. Host write 1 writes the entire LG0 (LP0-LP999) and this is a long sequential write, which goes to the first write stream and is placed in a LG block, (e.g., Block 10, Pages P0-P999). The LGM and LPM have the following entries:

| LGM(1) | | |
|---|---|---|
| LG# | LG Address | Dirty Flag |
| 0 | B10, P0 | 0 |

| LPM(1) | | |
|---|---|---|
| LPM Address | LG#, LP# | LP address |
| — | — | — |

The entire LG0 is written with no obsolete LPs yet, so it is "clean" as indicated by Dirty Flag=0 in the LGM. The LPM does not have any new entries.

2. Host write 2 writes an updated version of LG0, denoted by LG0' (LP0'-LP999'), and this is a long sequential write, which goes to the first write stream and is placed in the same LG block (e.g., Block 10, Pages 1000-1999) after the previous LG0. The LG Address is reset to B10, P1000. The previous LG0 becomes obsolete and the new version LG0' does not have obsolete LPs yet, so the Dirty Flag=0. The LGM and LPM have the following entries:

| LGM(2) | | |
|---|---|---|
| LG# | LG Address | Dirty Flag |
| 0 | B10, P1000 | 0 |

| LPM(2) | | |
|---|---|---|
| LPM Address | LG#, LP# | LP address |
| — | — | — |

Before this new LG0' write is completed, the latest LGM and LPM entries above are only in the cached Map in RAM. The non-volatile copy of LGM and LPM are not updated until the write is completed. So for a read operation, a lookup for the physical address of a given LP will involve the following:

(1) Check the cached map, if the LP is listed, get the physical address.

(2) If not in the cached map, read the LGM. If the LG entry is clean, then get the address from LGM.

(3) If the Dirty Flag indicates that it is not clean, look for the LP in the LPM at the address given in the LPM. If the LP is listed in the LPM, then get the physical address from the LPM.

(4) It the LP is not listed in the LPM, then get the physical address from the LGM.

3. Host write 3 writes another version of LP0', denoted by LP0", and this is a short non-sequential write, which goes to write stream 2 and is placed in a LP block (e.g., Block 80, Page 0). The logical group LG0 now contains an obsolete logical page LP0' with the updated LP0" in a LP block. So the Dirty Flag is set to "1" to denote that LG0 contains obsolete data (i.e., LP0'). While the newer version (LP0") is written to Block 80, Page 0, this address information is also recorded in the LPM map, whose entry is to be found in Block 2, Page 0. The LGM and LPM have the following entries:

| LGM(3) | | |
|---|---|---|
| LG# | LG Address | Dirty Flag |
| 0 | B10, P1000 | 1 |

| LPM(3) | | |
|---|---|---|
| LPM Address | LG#, LP# | LP address |
| B2, P0 | 0, 0 | B80, P0 |

As explained before, a portion of the LPM is also cached in the controller RAM for faster access. Since there is only 1 LPM entry update, it is likely to remain in the LPM entry. Typically, after a few LPM entries have accumulated they will be written altogether to the LPM in non-volatile memory. However, for the sake of illustration, the LPM entry shows as if it has already been written to the LPM in Block 2, Page 0.

4. Host write 4 writes another version of LP0" and LP1'-LP15', and this is deemed a sequential write, which goes to the first write stream and since the previous Block 10 storing LG0 is full, the new version is placed in a newly allocated LG block (e.g., Block 11, Page 0). This is an open-ended write, and also the mapping information is maintained in cache RAM. LG0 now contains obsolete pages LP0" and LP1'-LP15', with the updated versions in a new LG block. So the Dirty Flag is set to "1" to denote that LG0 contains obsolete data. For example, relative to the last LPM entry for LG0, the previous update LP0" is now itself rendered obsolete by LP0' which is stored in Block 11, Page 0. This address information is recorded in the LPM, whose entry is to be found in Block 2, Page 1.
The LGM and LPM have the following entries:

| LGM(4) | | |
|---|---|---|
| LG# | LG Address | Dirty Flag |
| 0 | B10, P1000 | 1 |

| LPM(4) | | |
|---|---|---|
| LPM Address | LG#, LP# | LP address |
| B2, P1 | 0, 0-15 | B11, P0-P15 |

5. Host write 5 writes another version of LP32', denoted by LP32", and this is deemed a short non-sequential write, which goes to write stream 2 and is the new version is placed in the next available page in existing LP block (e.g., Block 80, Page 1). This is addressed is entered in LPM at (e.g., Block 2, Page 2). LG0 now contains an obsolete page LP32'. So the Dirty Flag is set to "1" to denote that the LG contains obsolete data. The LGM and LPM have the following entries:

| LGM(5) | | |
|---|---|---|
| LG# | LG Address | Dirty Flag |
| 0 | B10, P1000 | 1 |

| LPM(5) | | |
|---|---|---|
| LPM Address | LG#, LP# | LP address |
| B2, P2 | 0, 32 | B80, P1 |

6. Host write 6 writes another version of LP0''' and LP1"-LP15", and this is deemed a sequential write, which goes to the first write stream. Since the previous Block 10 storing LG0 is full and the current write does not continue on the open-ended LG Block 11, Block 11 is closed to make room so that the current write is done on a newly allocated block (e.g., Block 12, Page 0). This is another open-ended write, and also the mapping information is maintained in cache RAM. LG0 now contains obsolete pages LP0" LP1"-LP15" and LP32', with the updated version of LP0"" and LP1" '-LP15" ' in a new LG block (B12, P0). So the Dirty Flag is set to "1" to denote that the LG contains obsolete data.

The open-ended Block 11 is closed by converting from a LG block to a LP block. This is accomplished simply by updating the LPM page. In this way, there is no need to copy existing data compared to conventional cases. After the conversion, the LGM and LPM have the following entries for LG0:

| LGM(6) | | |
|---|---|---|
| LG# | LG Address | Dirty Flag |
| 0 | B10, P1000 | 1 |

| LPM(6) | | |
|---|---|---|
| LPM Address | LG#, LP# | LP address |
| B2, P3 | 0, 0-15 | B12, P0-P15 |
| | 0, 32 | B80, P1 |

After the new LG block 12 is allocated, it will essentially be similar to the situation given in host write 4.

Figure 14:
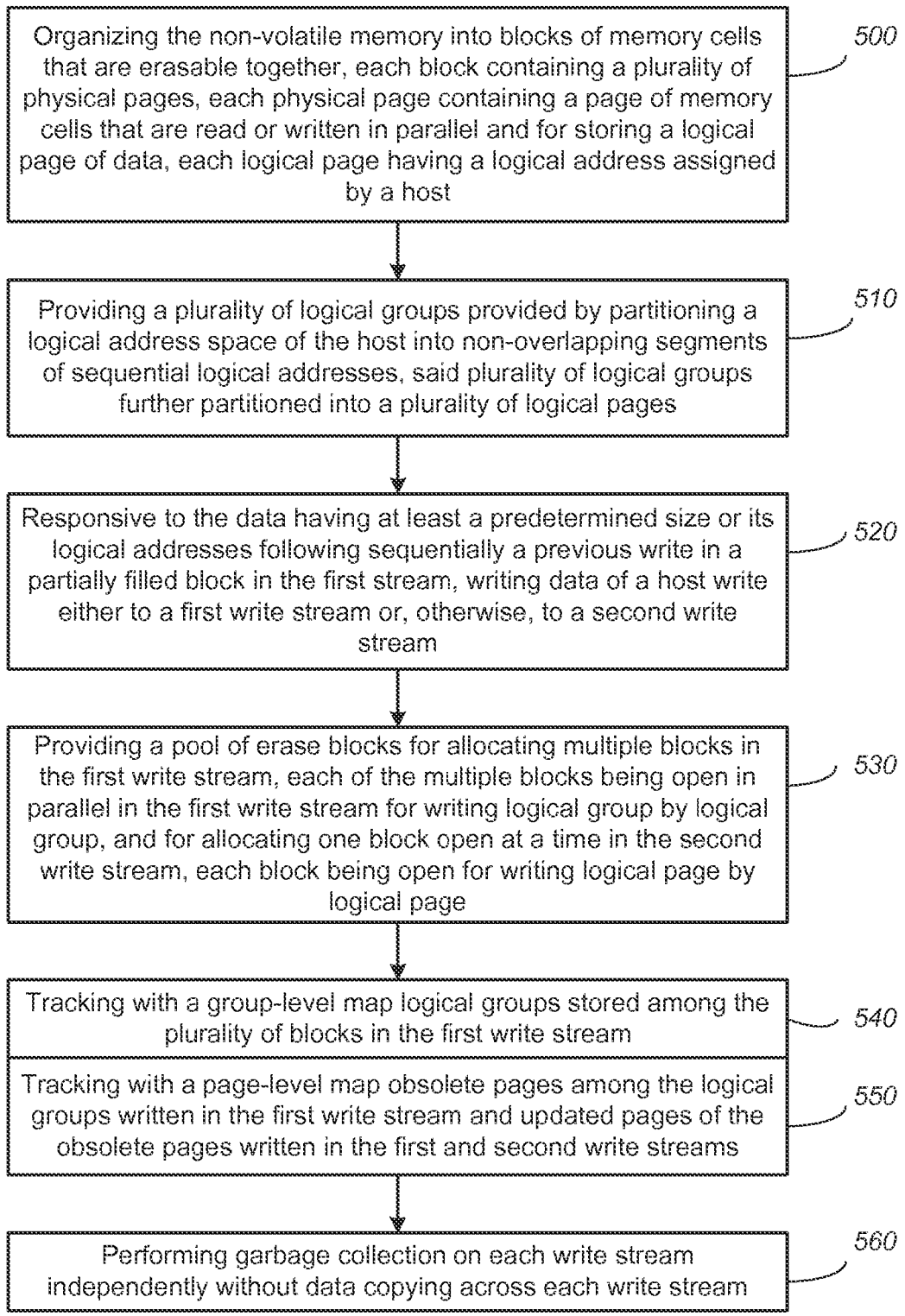
FIG. 14 is a flow diagram illustrating the operation of the memory with the adaptive group architecture.

FIG. 14 is a flow diagram illustrating the operation of the memory with the adaptive group architecture.

STEP 500: Organizing the non-volatile memory into blocks of memory cells that are erasable together, each block containing a plurality of physical pages, each physical page containing a page of memory cells that are read or written in parallel and for storing a logical page of data, each logical page having a logical address assigned by a host.

STEP 510: Providing a plurality of logical groups provided by partitioning a logical address space of the host into non-overlapping segments of sequential logical addresses, said plurality of logical groups further partitioned into a plurality of logical pages.

STEP 520: Responsive to the data having at least a predetermined size or its logical addresses following sequentially a previous write in a partially filled block in the first stream, writing data of a host write either to a first write stream or, otherwise, to a second write stream.

STEP 530: Providing a pool of erase blocks for allocating multiple blocks in the first write stream, each of the multiple blocks being open in parallel in the first write stream for writing logical group by logical group, and for allocating one block open at a time in the second write stream, each block being open for writing logical page by logical page.

STEP 540: Tracking with a group-level map logical groups stored among the plurality of blocks in the first write stream.

STEP 550: Tracking with a page-level map obsolete pages among the logical groups written in the first write stream and updated pages of the obsolete pages written in the first and second write streams.

STEP 560: Performing garbage collection on each write stream independently without data copying across each write stream.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modi- It is claimed:

1. A nonvolatile memory, comprising:
an array of memory cells organized into blocks as erase units and physical pages as read/write units, each physical page for storing a logical page of data, each logical page having a logical address assigned by a host;
a plurality of logical groups provided by partitioning a logical address space of the host into non-overlapping groups of sequential logical addresses, each logical group comprising a plurality of corresponding logical pages;
a controller, for writing data from a host write to either a first write stream or a second write stream;
a pool of erase blocks for allocating multiple blocks in the first write stream, each of the multiple blocks being open in parallel in the first write stream for writing logical group by logical group, and for allocating blocks sequentially in the second write stream, each of the sequentially allocated blocks being open one at a time for writing logical page by logical page;
said controller, responsive to the data from the host write having at least a predetermined size or its logical addresses following sequentially a previous write in a partially filled block in the first write stream, for writing the data to the first write stream, otherwise, for writing the data from the host write to the second write stream;
a group-level map for tracking logical groups stored among the plurality of blocks in the first write stream, said group-level map being maintained in said non-volatile memory with a copy of said group-level map cached in a random-access memory (RAM) of said controller;
a page-level map for tracking obsolete pages among the logical groups written in the first write stream and updated pages of the obsolete pages written in the first and second write streams, said page-level map being maintained in said non-volatile memory with at least a portion of a copy of said page-level map cached in the RAM of said controller; and
said controller performing garbage collection independently on each of the first and second write streams without data being copied between each of the first and second write streams.

2. A nonvolatile memory as in claim 1, wherein:
a block containing obsolete and valid logical pages to be reclaimed in a given write stream has the valid logical pages salvaged to another block of the same given write stream in a garbage collection before being erased and added to the pool of erase blocks.

3. The nonvolatile memory as in claim 1, wherein:
the predetermined size allows writing the blocks logical group by logical group in the first write stream without the need to allocate a new block beyond a predetermined allocation frequency.

4. The nonvolatile memory as in claim 1, wherein the predetermined size is 64 kilobytes (KB).

5. The nonvolatile memory as in claim 1, wherein:
the data from the host write has a starting logical address that follows sequentially on a previous write in a partially filled block in the first write stream; and
said controller has the data from the host write appended after the previous write in the partially filled block.

6. The nonvolatile memory as in claim 1, wherein:
the data from the host write does not have a starting logical address that follows sequentially on a previous write in a partially filled block in the first write stream but is at least of the predetermined size; and
said controller has the data from the host write written to a new block allocated to the first write stream.

7. The nonvolatile memory as in claim 1, wherein each of the memory cells stores one bit of data.

8. The nonvolatile memory as in claim 1, wherein each of the memory cells stores more than one bit of data.

9. The nonvolatile memory as in claim 1, wherein:
said group-level map includes a flag for each logical group to indicate whether or not a corresponding logical group contains an obsolete logical page.

10. The nonvolatile memory as in claim 9, wherein:
when the flag for a logical group indicates that the logical group in a block contains an obsolete logical page, any obsolete logical pages in the logical group is located in the block by said page-level map.

11. A method of operating a non-volatile memory, comprising:
organizing the non-volatile memory into blocks of memory cells that are erasable together, each block containing a plurality of physical pages, each physical page containing a page of memory cells that are read or written in parallel and are for storing a logical page of data, each logical page having a logical address assigned by a host;
providing a plurality of logical groups by partitioning a logical address space of the host into non-overlapping groups of sequential logical addresses, said plurality of logical groups further partitioned into a plurality of logical pages;
writing data from a host write either to a first write stream or to a second write stream;
providing a pool of erase blocks for allocating multiple blocks in the first write stream, each of the multiple blocks being open in parallel in the first write stream for writing logical group by logical group, and for allocating blocks sequentially in the second write stream, each of the sequentially allocated blocks being open one at a time for writing logical page by logical page;
responsive to the data from the host write having at least a predetermined size or its logical addresses following sequentially a previous write in a partially filled block in the first write stream, for writing the data from the host write to the first write stream, otherwise, for writing the data from the host write to the second write stream;
tracking, with a group-level map, logical groups stored among the plurality of blocks in the first write stream, said group-level map being maintained in said non-volatile memory with a copy cached in a random-access memory (RAM) of a controller of said non-volatile memory;
tracking, with a page-level map, obsolete pages among the logical groups written in the first write stream and updated pages of the obsolete pages written in the first and second write streams, said page-level map being maintained in said non-volatile memory with at least a portion of a copy cached in the RAM of said controller; and
performing garbage collection independently on each of the first and second write streams without data being copied between each of the first and second write streams.

12. The method as in claim 11, further comprising:
reclaiming a block containing obsolete and valid logical pages in a given write stream in a garbage collection by salvaging the valid logical pages to another block of the same given write stream;
erasing the reclaimed block; and
adding the reclaimed block to the pool of erase blocks.

13. The method as in claim 12, wherein:
the predetermined size allows writing the blocks logical group by logical group in the first write stream without the need to allocate a new block beyond a predetermined allocation frequency.

14. The method as in claim 11, wherein the predetermined size is 64 kilobytes (KB).

15. The method as in claim 11, wherein:
the data from the host write has a starting logical address that follows sequentially on a previous write in a partially filled block in the first write stream; and
said writing data from the host write appends the data from the host write after the previous write in the partially filled block.

16. The method as in claim 11, wherein:
the data from the host write does not have a starting logical address that follows sequentially on a previous write in a partially filled block in the first write stream but is at least of the predetermined size; and
said writing data from the host write writes the data from the host write to a new block allocated to the first write stream.

17. The method as in claim 11, wherein each of the memory cells stores one bit of data.

18. The method as in claim 11, wherein each of the memory cells stores more than one bit of data.

19. The method as in claim 11, wherein:
said group-level map includes a flag for each logical group to indicate whether or not a corresponding logical group contains an obsolete logical page.

20. The method as in claim 19, wherein:
when the flag for a logical group indicates that the logical group in a block contains an obsolete logical page, any obsolete logical pages in the logical group is located in the block by said page-level map.

* * * * *